US009514932B2

(12) United States Patent
Mallick et al.

(10) Patent No.: US 9,514,932 B2
(45) Date of Patent: Dec. 6, 2016

(54) FLOWABLE CARBON FOR SEMICONDUCTOR PROCESSING

(71) Applicant: Applied Materials, Santa Clara, CA (US)

(72) Inventors: Abhijit Basu Mallick, Palo Alto, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 227 days.

(21) Appl. No.: 13/942,874

(22) Filed: Jul. 16, 2013

(65) Prior Publication Data

US 2014/0045342 A1  Feb. 13, 2014

Related U.S. Application Data

(60) Provisional application No. 61/680,758, filed on Aug. 8, 2012.

(51) Int. Cl.
  *H01L 21/02* (2006.01)
  *C23C 16/26* (2006.01)
  *H01L 21/66* (2006.01)
  *H01L 21/768* (2006.01)

(52) U.S. Cl.
  CPC .......... *H01L 21/0226* (2013.01); *C23C 16/26* (2013.01); *H01L 21/0262* (2013.01); *H01L 21/02115* (2013.01); *H01L 21/02274* (2013.01); *H01L 21/02277* (2013.01); *H01L 21/02527* (2013.01); *H01L 21/7682* (2013.01); *H01L 22/12* (2013.01); *H01L 22/20* (2013.01)

(58) Field of Classification Search
  CPC ............ H01L 21/0226; H01L 21/02115; H01L 21/02274;H01L 21/0262; H01L 21/02527; H01L 21/02277; H01L 51/0048; H01L 21/66; C23C 16/26
  USPC .................. 438/5, 422, 478, 778; 257/9, 24, 257/E21.528, E21.573, 763
  See application file for complete search history.

(56) References Cited

U.S. PATENT DOCUMENTS

| 4,975,144 | A | 12/1990 | Yamazaki et al. |
| 5,152,834 | A | 10/1992 | Allman |
| 5,186,745 | A | 2/1993 | Maniar |
| 5,198,263 | A | 3/1993 | Stafford et al. |

(Continued)

FOREIGN PATENT DOCUMENTS

KR  10-2011-0008220 A  1/2011
KR  10-2011-0052633 A  5/2011

OTHER PUBLICATIONS

International Search Report mailed Jan. 13, 2014 for PCT/US2013/050906, 10 pages.

*Primary Examiner* — Thinh T Nguyen
(74) *Attorney, Agent, or Firm* — Kilpatrick Townsend & Stockton LLP

(57) ABSTRACT

Methods are described for forming flowable carbon layers on a semiconductor substrate. A local excitation (such as a hot filament in hot wire CVD, a plasma in PECVD or UV light) may be applied as described herein to a silicon-free carbon-containing precursor containing a hydrocarbon to form a flowable carbon-containing film on a substrate. A remote excitation method has also been found to produce flowable carbon-containing films by exciting a stable precursor to produce a radical precursor which is then combined with unexcited silicon-free carbon-containing precursors in the substrate processing region.

20 Claims, 4 Drawing Sheets

(56) References Cited

U.S. PATENT DOCUMENTS

| | | | |
|---|---|---|---|
| 5,250,472 | A | 10/1993 | Chen et al. |
| 5,401,543 | A | 3/1995 | O'Neill et al. |
| 5,470,661 | A | 11/1995 | Bailey et al. |
| 5,691,010 | A | 11/1997 | Kuramoto et al. |
| 5,939,149 | A | 8/1999 | Jang et al. |
| 6,331,332 | B1 | 12/2001 | Wang |
| 6,423,384 | B1 | 7/2002 | Khazeni et al. |
| 6,572,937 | B2 | 6/2003 | Hakovirta et al. |
| 6,573,167 | B2 | 6/2003 | Xing et al. |
| 6,897,163 | B2 * | 5/2005 | Gaillard .................. C23C 16/30 257/E21.259 |
| 7,407,893 | B2 | 8/2008 | Seamons et al. |
| 7,638,440 | B2 | 12/2009 | Wang et al. |
| 2004/0096672 | A1 * | 5/2004 | Lukas .................... C23C 16/401 428/446 |
| 2004/0152338 | A1 * | 8/2004 | Gaillard .................. C23C 16/30 438/778 |
| 2005/0199585 | A1 | 9/2005 | Wang et al. |
| 2007/0111543 | A1 | 5/2007 | Woo et al. |
| 2007/0281106 | A1 | 12/2007 | Lubomirsky et al. |
| 2011/0045208 | A1 | 2/2011 | Ohtake et al. |
| 2011/0165057 | A1 | 7/2011 | Honda et al. |
| 2011/0165781 | A1 | 7/2011 | Liang et al. |
| 2011/0274852 | A1 | 11/2011 | Ito et al. |
| 2012/0070957 | A1 * | 3/2012 | Mallick ............. H01L 21/02271 438/422 |
| 2013/0149874 | A1 * | 6/2013 | Hirose et al. ................. 438/763 |

* cited by examiner

FLOWABLE CARBON FOR SEMICONDUCTOR PROCESSING

CROSS-REFERENCES TO RELATED APPLICATIONS

This application claims the benefit of U.S. Prov. Pat. App. No. 61/680,758 filed Aug. 8, 2012, and titled "FLOWABLE CARBON FOR SEMICONDUCTOR PROCESSING," by Abhijit Basu Mallick et al., the entire disclosure of which is hereby incorporated herein in its entirety by reference for all purposes.

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The miniaturization of semiconductor circuit elements has reached a point where feature sizes of 45 nm, 32 nm, 28 nm and even 20 nm are fabricated on a commercial scale. As the dimensions continue to get smaller, new challenges arise for process steps like filling a gap between circuit elements with a variety of materials. As the width between the elements continues to shrink, the gap between them often gets taller and narrower, making the gap difficult to fill without the dielectric material getting stuck to create voids and weak seams. Conventional chemical vapor deposition (CVD) techniques often experience an overgrowth of material at the top of the gap before it has been completely filled. This can create a void or seam in the gap where the depositing dielectric material has been prematurely cut off by the overgrowth; a problem sometimes referred to as breadloafing.

One solution to the breadloafing problem has been to use a silicon precursor and a plasma-excited precursor combined in a plasma-free substrate processing region to form a nascently-flowable dielectric film. The as-deposited flowability allows the film to fill gaps with a silazane-containing film using this chemical vapor deposition technique. The silazane film may be processed subsequently to transition the film to, for example, silicon oxide. Such a chemical vapor deposition has been found to produce better gapfill properties than spin-on glass (SOG) and spin-on dielectric (SOD). While the deposition of flowable dielectric films deposited by CVD has fewer breadloafing problems, such techniques are still unavailable for some classes of material.

While the new flowable CVD techniques represent a significant breakthrough in filling tall, narrow (i.e., high-aspect ratio) gaps with dielectric materials such as silicon-containing films such as silicon-nitride-hydride and silicon oxide, there is still a need for techniques that can seamlessly fill such gaps with carbon materials. Among other topics, the present application addresses this need by describing flowable CVD techniques for forming carbon films on a substrate.

BRIEF SUMMARY OF THE INVENTION

Methods are described for forming flowable carbon layers on a semiconductor substrate. A local excitation (such as a hot filament in hot wire CVD, a plasma in PECVD or UV light) may be applied as described herein to a silicon-free carbon-containing precursor containing a hydrocarbon to form a flowable carbon-containing film on a substrate. A remote excitation method has also been found to produce flowable carbon-containing films by exciting a stable precursor to produce a radical precursor which is then combined with unexcited silicon-free carbon-containing precursors in the substrate processing region.

Embodiments of the invention include methods of forming a silicon-free carbon-containing layer on a semiconductor substrate inside a substrate processing region within a chemical vapor deposition chamber. The method includes flowing a silicon-free carbon-containing precursor to the substrate processing region, wherein the silicon-free carbon-containing precursor comprises a hydrocarbon and wherein the silicon-free carbon-containing precursor. The method further includes reacting the silicon-free carbon-containing precursor in the substrate processing region to deposit a flowable silicon-free carbon-containing layer on the substrate. The silicon-free carbon-containing layer comprises C—H bonds.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Methods are described for forming flowable carbon layers on a semiconductor substrate. A local excitation (such as a hot filament in hot wire CVD, a plasma in PECVD or UV light) may be applied as described herein to a silicon-free carbon-containing precursor containing a hydrocarbon to form a flowable carbon-containing film on a substrate. A remote excitation method has also been found to produce flowable carbon-containing films by exciting a stable precursor to produce a radical precursor which is then combined with unexcited silicon-free carbon-containing precursors in the substrate processing region.

In the case of a local excitation, a hot filament may be used to excite the silicon-free carbon-containing precursor in a deposition technique referred to as hot-wire chemical vapor deposition (HW-CVD). UV light or a local plasma may also be used to excite the silicon-free carbon-containing precursor. The inventors have determined that these techniques can be modified to form a flowable carbon-containing film on a substrate in the same substrate processing region housing the excitation region. Precautions taught herein must be taken to ensure that adequate recombination and de-excitation takes place before the precursors travel to the substrate. The recombination and de-excitation removes ionized species from the reactant flow and enable the nascent film to flow prior to solidification. Appropriate precautions to ensure the formation of flowable carbon-containing films will be taught after the following discussion, which relates to an exemplary remote-plasma technique which also produces flowable carbon-containing films. The flowrates, silicon-free precursors and process parameters presented in the ensuing discussion also apply to the local plasma techniques.

In an exemplary remote plasma CVD process, the carbon constituents may come from a hydrocarbon precursor which is excited by a radical precursor formed in a remote plasma formed outside the substrate processing region. The radical precursor may be formed from oxygen, ammonia, argon, hydrogen, carbon monoxide, nitrous oxide or the like. The remote plasma may be a remote plasma system or a compartment within the same substrate processing system but separated from the substrate processing region by a showerhead. The radical precursor has been activated, in part, to form a flowable carbon film when combined the hydrocarbon precursor at low deposition temperatures. In those parts of the substrate that are structured with high-aspect ratio gaps, the flowable carbon material may be deposited into those gaps with significantly fewer voids and weak seams.

Exemplary Flowable Carbon Film Deposition Methods

Figure 1:
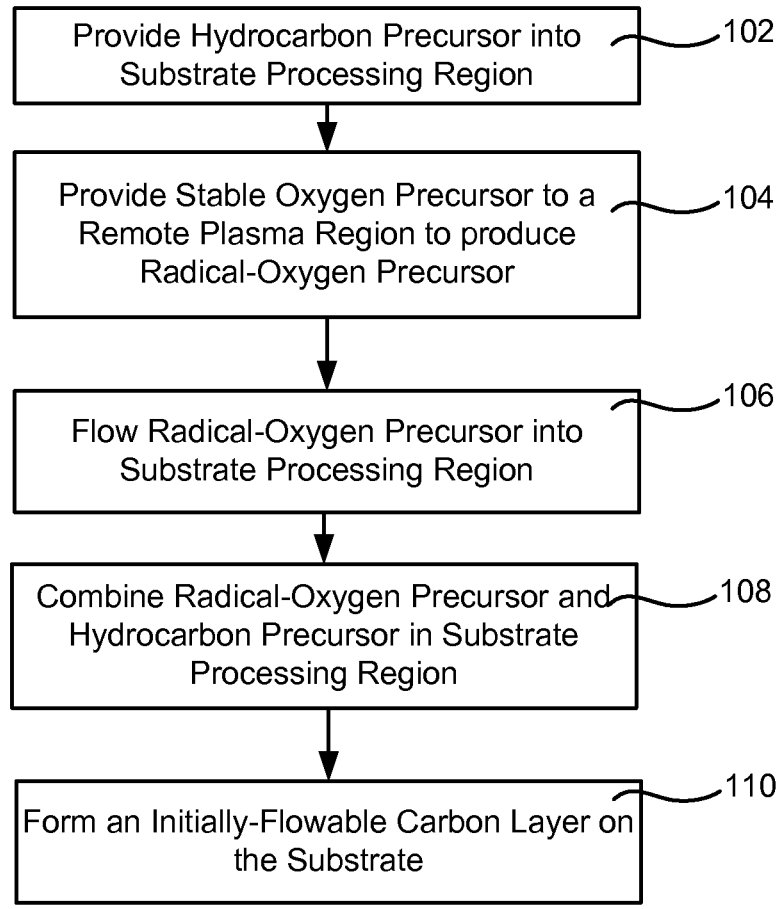
FIG. 1 is a flowchart illustrating selected steps in a method of forming a silicon-carbon-nitrogen containing dielectric layer on a substrate.

In order to better understand and appreciate the invention, reference is now made to FIG. 1 which is a flowchart showing selected steps in a method of forming an initially flowable silicon-free carbon-containing layer on a substrate according to embodiments of the invention. The method includes the step of providing a silicon-free carbon-containing precursor 102 to a substrate processing region of a chemical vapor deposition chamber. The silicon-free carbon-containing precursor provides the carbon used in forming an initially-flowable silicon-free carbon-containing layer.

Silicon-free carbon-containing precursors include hydrocarbons and consist of hydrocarbons in embodiments of the invention. The silicon-free carbon-containing precursor may consist of carbon and hydrogen and have no fluorine (or other halogen) in disclosed embodiments. Exemplary silicon-free carbon-containing precursors include alkanes, alkenes, alkynes, ketones, imines and esters. The silicon-free carbon-containing precursors may be methane, ethane, ethylene, acetylene, propane, propene, propyne, butane, butene, butyne, hexane, hexene, hexyne, heptane, heptene, heptyne, octane, octene, octyne, among others. The silicon-free carbon-containing precursor may be an aromatic hydrocarbon. Exemplary silicon-free carbon-containing precursors also include benzene, toluene, xylene, mesitylene, phenol, anisole, cresol, furan, aniline and pyridine in embodiments of the invention. In a preferred embodiment, the silicon-free carbon-containing precursor may be ethylene, acetylene, toluene or aniline.

Generally speaking, the silicon-free carbon-containing precursor may include carbon and hydrogen, but may also include oxygen and/or nitrogen. In particular embodiments, the silicon-free carbon-containing precursor may consist of carbon and hydrogen. The silicon-free carbon-containing precursor may consist of carbon, hydrogen and oxygen or it may consist of carbon, hydrogen and nitrogen. The silicon-free carbon-containing precursor may also consist of carbon, hydrogen, oxygen and nitrogen in disclosed embodiments.

A stable precursor is flowed into a remote plasma region (operation 104) to produce a radical precursor. The stable precursor in the example was oxygen ($O_2$) and the radical precursor included excited remnants included $O_2$ and $O_3$ as well as vibrationally and electrically excited oxygen species and some ionized oxygen-containing species. Together, the excited remnants will be referred to as a radical-oxygen precursor in the example of FIG. 1. The radical-oxygen precursor was flowed into the substrate processing region through a showerhead (operation 106), where the radical-oxygen precursor combined with the hydrocarbon precursor (operation 108). The hydrocarbon precursor has not been flowed through a plasma and is only excited by the radical precursor (in this example a radical-oxygen precursor). The unexcited hydrocarbon precursor and the radical-oxygen precursor have been found to combine in such a way as to form an initially-flowable silicon-free carbon-containing layer (operation 110) as determined by scanning electron microscopy (SEM).

The stable precursor was oxygen ($O_2$) in this example. In general, the stable precursor may include $O_2$, $NH_3$, $H_2$, CO or $N_2O$. The hydrogen-containing precursor may be accompanied by one or more additional gases such a helium, neon, argon, xenon, etc. The flow rate of the stable precursor (and therefore the radical precursor) may be greater than or about 300 sccm, greater than or about 500 sccm or greater than or about 700 sccm in disclosed embodiments. The flow rate of the carbon-containing precursor may be greater than or about 100 sccm, greater than or about 200 sccm, greater than or about 250 sccm, greater than or about 275 sccm, greater than or about 300 sccm, greater than or about 350 sccm, greater than or about 400 sccm, etc. or more in disclosed embodiments.

The semiconductor substrate used for depositing the silicon-carbon-and-hydrogen-containing layer and forming the silicon-and-carbon-containing layer may be a patterned semiconductor substrate and may have a plurality of gaps for the spacing and structure of device components (e.g., transistors) formed on the semiconductor substrate. The gaps may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths of that range from about 90 nm to about 22 nm or less (e.g., less than 90 nm, 65 nm, 50 nm, 45 nm, 32 nm, 22 nm, 16 nm, etc.). Because the silicon-carbon-and-hydrogen-containing layer is initially-flowable, it can fill gaps with high aspect ratios without creating voids or weak seams around the center of the filling material. For example, a depositing flowable material is less likely to prematurely clog the top of a gap before it is completely filled to leave a void in the middle of the gap.

Measured by atomic concentration, the silicon-free carbon-containing layer may contain at least 70% carbon, at least 75% carbon, at least 80% carbon and at least 85% carbon in embodiments of the invention. Generally speaking, the silicon-free carbon-containing layer may include carbon and hydrogen, but may also include oxygen and/or nitrogen. In particular embodiments, the silicon-free carbon-containing layer may consist of carbon and hydrogen. The silicon-free carbon-containing layer may consist of carbon, hydrogen and oxygen or it may consist of carbon, hydrogen and nitrogen. The silicon-free carbon-containing layer may also consist of carbon, hydrogen, oxygen and nitrogen in disclosed embodiments.

The stable precursor may be energized by a plasma formed in a remote plasma system (RPS) positioned outside or inside the deposition chamber in order to form the radical precursor. The stable precursor may be exposed to the remote plasma where it is dissociated, radicalized, and/or otherwise transformed into the plasma effluents also known as the radical precursor. The radical precursor is then introduced to the substrate processing region to mix for the first time with the separately introduced silicon-free carbon-containing precursor. Exciting the silicon-free carbon-containing precursor by contact with the radical precursor, rather than directly by a plasma, forms unique deposition intermediaries. These intermediaries would not be present if a plasma were to directly excite the silicon-free carbon-containing precursor. These deposition intermediaries may contain longer carbon chains which enable the silicon-free carbon-containing layer to be initially-flowable unlike conventional carbon-containing layer deposition techniques. The flowable nature during formation allows the layer to flow into narrow features before solidifying.

Alternatively (or in addition) to an exterior plasma region, the stable precursor may be excited in a plasma region inside the deposition chamber. This plasma region may be partitioned from the substrate processing region. The precursors mix and react in the substrate processing region to deposit the initially-flowable silicon-free carbon-containing layer on the exposed surfaces of the substrate. Regardless of the location of the plasma region, the substrate processing region may be described as a "plasma free" region during the deposition process. It should be noted that "plasma free" does not necessarily mean the region is devoid of plasma. The borders of the plasma in the chamber plasma region are hard to define and may encroach upon the substrate processing region through, for example, the apertures of a showerhead if one is being used to transport the precursors to the substrate processing region. If an inductively-coupled plasma is incorporated into the deposition chamber, a small amount of ionization may even be initiated in the substrate processing region during a deposition without deviating from the scope of the present invention. All causes for a plasma having much lower ion density than the chamber plasma region during the creation of the radical nitrogen precursor do not deviate from the scope of "plasma-free" as used herein.

The silicon-free carbon-containing layer is formed on the substrate and is initially-flowable during deposition. The origin of the flowability may be linked to the presence of hydrogen in the film, in addition to carbon. The hydrogen is thought to reside as C—H bonds in the film which may aid in the initial flowability. As a consequence, the silicon-free carbon-containing layer may be a silicon-free carbon-and-hydrogen-containing layer in embodiments of the invention. The temperature in the reaction region of the substrate processing region may be low (e.g., less than 100° C.) and the total chamber pressure may be about 0.1 Torr to about 10 Torr (e.g., about 0.5 to about 6 Torr, etc.) during the deposition of the silicon-carbon-and-hydrogen-containing layer. The temperature may be controlled in part by a temperature controlled pedestal that supports the substrate. The pedestal may be thermally coupled to a cooling/heating unit that adjust the pedestal and substrate temperature to, for example, about 0° C. to about 150° C. The flowability does not rely on a high substrate temperature, therefore, the initially-flowable silicon-free carbon-containing layer may fill gaps even on relatively low temperature substrates. During the formation of the silicon-free carbon-containing layer, the substrate temperature may be below or about 400° C., below or about 300° C., below or about 200° C., below or about 150° C. or below or about 100° C. in embodiments of the invention.

The initially flowable silicon-free carbon-containing layer may be deposited on exposed planar surfaces a well as into gaps. As measured on an open area on the patterned substrate, the deposition thickness may be about 50 Å or more, about 100 Å or more, about 150 Å or more, about 200 Å or more, about 300 Å or more, or about 400 Å, in disclosed embodiments. The deposition thickness may be about 2 kÅ or less, about 1.5 kÅ or less, about 1 kÅ or less, about 800 Å or less, about 600 Å or less, or about 500 Å, in embodiments of the invention. Additional disclosed embodiments may be obtained by combining one of these upper limits with one of the lower limits.

When the initially-flowable silicon-free carbon-containing layer reaches a desired thickness, the process effluents may be removed from the deposition chamber. These process effluents may include any unreacted radical precursor and carbon-containing precursor, diluent and/or carrier gases, and reaction products that did not deposit on the substrate. The process effluents may be removed by evacuating the deposition chamber and/or displacing the effluents with non-deposition gases in the deposition region.

As indicated previously, a local excitation may be used in place of the exemplary configuration. For example. a hot filament may be used to excite the silicon-free carbon-containing precursor in HW-CVD. Prior art techniques involve positioning the hot wire (e.g. tungsten or another refractory metal) close the substrate to grow diamond or diamond-like carbon (DLC) at relatively high growth rates. Semiconductor gapfill applications often do not require or desire thick films and associated high growth rates. As a result, the hot wire or filament may be relocated away from the substrate which allows sufficient recombination to occur and a flowable silicon-free carbon-containing film to form on the substrate. The temperature of the substrate must be low (embodiments provided previously) to ensure the appropriate chemical mechanisms occur on the surface to result in a flowable silicon-free carbon-containing film. For example, the substrate may be maintained at temperatures between −20° C. and 400° C., between −20° C. and 200° C. or between −20° C. and 120° C. during film deposition in disclosed embodiments. UV light or a local plasma may also be used to excite the silicon-free carbon-containing precursor. The UV light may be shone in a region away from the substrate analogous to the HW-CVD example or may be reduced in intensity, or both. PE-CVD may also be used to form the flowable silicon-free carbon-containing film by reducing the local plasma intensity to below about 100 Watts, below about 50 Watts, below about 40 Watts, below about 30 Watts or below about 20 Watts in disclosed embodiments. The local plasma may be greater than 3 Watts or greater than 5 Watts in embodiments. Any of the upper bounds can be combined with any of the lower bounds to form additional embodiments. The plasma may be effected by applying RF energy by capacitively-coupled power between, e.g., the gas distribution showerhead and the pedestal/substrate. Such low powers are typically not used in prior art systems as a result of plasma instability and previously undesirably low film growth rates. Low substrate temperatures (as outlined previously) are required in all embodiments described herein in order to form flowable silicon-free carbon-containing films. Higher process pressures also help de-excitation and promote a flowable film and the substrate processing region may be maintained at a pressure between 0.1 Torr and 10 Torr in embodiments of the invention. For PE-CVD, the separation between a gas supply showerhead may be increased to spacing undesirable for prior art processes. Greater gas supply to substrate face spacings of 0.2" to 2", 0.4" to 1.5" or 0.5" to 1" have been found to produce flowable silicon-free carbon-containing films in disclosed embodiments. These spaces also apply to substrate excitation spaces for HW-CVD and UV excitation regions as well.

Additional process parameters will be introduced in the course of describing some exemplary hardware.

Exemplary Deposition Systems

Deposition chambers that may implement embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Examples of substrate processing chambers that can be used with exemplary methods of the invention may include those shown and described in co-assigned U.S. Provisional Patent App. No. 60/803,499 to Lubomirsky et al, filed May 30, 2006, and titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 2:
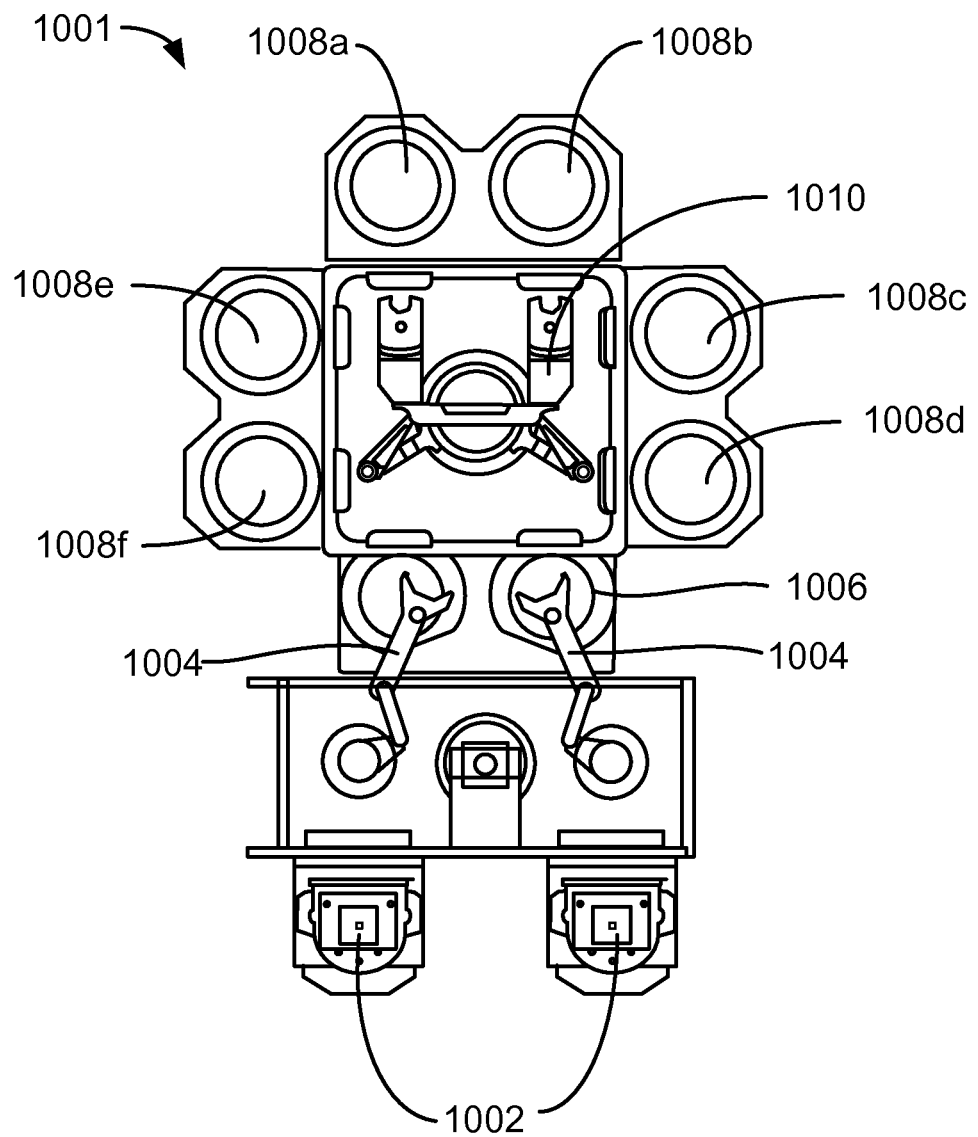
FIG. 2 shows a substrate processing system according to embodiments of the invention.

Embodiments of the deposition systems may be incorporated into larger fabrication systems for producing integrated circuit chips. FIG. 2 shows one such system 1001 of deposition and other processing chambers according to disclosed embodiments. In the figure, a pair of FOUPs (front opening unified pods) 1002 supply substrate substrates (e.g., 300 mm diameter wafers) that are received by robotic arms 1004 and placed into a low pressure holding area 1006 before being placed into one of the wafer processing chambers 1008a-f. A second robotic arm 1010 may be used to transport the substrate wafers from the holding area 1006 to the processing chambers 1008a-f and back. The processing chambers 1008a-f may include one or more system components for depositing a flowable dielectric film on the substrate wafer. In one configuration, all three pairs of chambers (e.g., 1008a-f) may be configured to deposit a flowable dielectric film on the substrate. Any one or more of the processes described may be carried out on chamber(s) separated from the fabrication system shown in different embodiments.

Figure 3A:
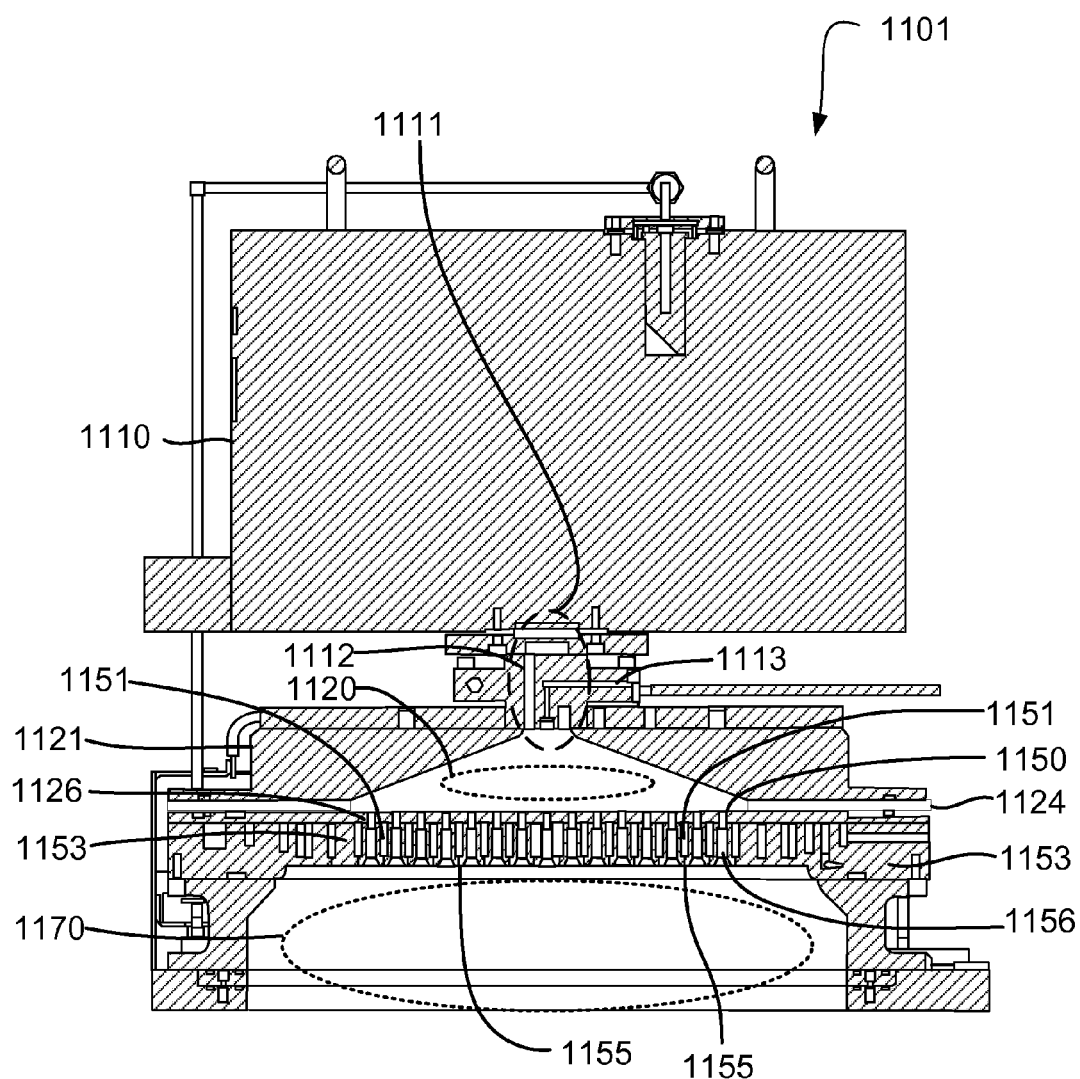
FIG. 3A shows a substrate processing chamber according to embodiments of the invention.

FIG. 3A is a substrate processing chamber 1101 according to disclosed embodiments. A remote plasma system (RPS) 1110 may process a gas which then travels through a gas inlet assembly 1111. Two distinct gas supply channels are visible within the gas inlet assembly 1111. A first channel 1112 carries a gas that passes through the remote plasma system (RPS) 1110, while a second channel 1113 bypasses the RPS 1110. The first channel 1112 may be used for the process gas and the second channel 1113 may be used for a treatment gas in disclosed embodiments. The lid (or conductive top portion) 1121 and a perforated partition 1153 are shown with an insulating ring 1124 in between, which allows an AC potential to be applied to the lid 1121 relative to perforated partition 1153. The process gas travels through first channel 1112 into chamber plasma region 1120 and may be excited by a plasma in chamber plasma region 1120 alone or in combination with RPS 1110. The combination of chamber plasma region 1120 and/or RPS 1110 may be referred to as a remote plasma system herein. The perforated partition (also referred to as a showerhead) 1153 separates chamber plasma region 1120 from a substrate processing region 1170 beneath showerhead 1153. Showerhead 1153 allows a plasma present in chamber plasma region 1120 to avoid directly exciting gases in substrate processing region 1170, while still allowing excited species to travel from chamber plasma region 1120 into substrate processing region 1170.

Showerhead 1153 is positioned between chamber plasma region 1120 and substrate processing region 1170 and allows plasma effluents (excited derivatives of precursors or other gases) created within chamber plasma region 1120 to pass through a plurality of through holes 1156 that traverse the thickness of the plate. The showerhead 1153 also has one or more hollow volumes 1151 which can be filled with a precursor in the form of a vapor or gas (such as a silicon-free carbon-containing precursor) and pass through small holes 1155 into substrate processing region 1170 but not directly into chamber plasma region 1120. Showerhead 1153 is thicker than the length of the smallest diameter 1150 of the through-holes 1156 in this disclosed embodiment. In order to maintain a significant concentration of excited species penetrating from chamber plasma region 1120 to substrate processing region 1170, the length 1126 of the smallest diameter 1150 of the through-holes may be restricted by forming larger diameter portions of through-holes 1156 part way through the showerhead 1153. The length of the smallest diameter 1150 of the through-holes 1156 may be the same order of magnitude as the smallest diameter of the through-holes 1156 or less in disclosed embodiments.

In the embodiment shown, showerhead 1153 may distribute (via through holes 1156) process gases which contain oxygen, hydrogen and/or nitrogen and/or plasma effluents of such process gases upon excitation by a plasma in chamber plasma region 1120. In embodiments, the process gas introduced into the RPS 1110 and/or chamber plasma region 1120 through first channel 1112 may contain one or more of oxygen ($O_2$), ozone ($O_3$), $N_2O$, NO, $NO_2$, $NH_3$, $N_xH_y$ including $N_2H_4$, CO, $CO_2$. The process gas may also include a carrier gas such as helium, argon, nitrogen ($N_2$), etc. The second channel 1113 may also deliver a process gas and/or a carrier gas. Plasma effluents may include ionized or neutral derivatives of the process gas and may also be referred to herein as a radical precursor or even a radical-oxygen precursor and/or a radical-nitrogen precursor referring to the atomic constituents of the process gas introduced.

In embodiments, the number of through-holes 1156 may be between about 60 and about 2000. Through-holes 1156 may have a variety of shapes but are most easily made round. The smallest diameter 1150 of through holes 1156 may be between about 0.5 mm and about 20 mm or between about 1 mm and about 6 mm in disclosed embodiments.

There is also latitude in choosing the cross-sectional shape of through-holes, which may be made conical, cylindrical or a combination of the two shapes. The number of small holes 1155 used to introduce a gas into substrate processing region 1170 may be between about 100 and about 5000 or between about 500 and about 2000 in different embodiments. The diameter of the small holes 1155 may be between about 0.1 mm and about 2 mm.

Figure 3B:
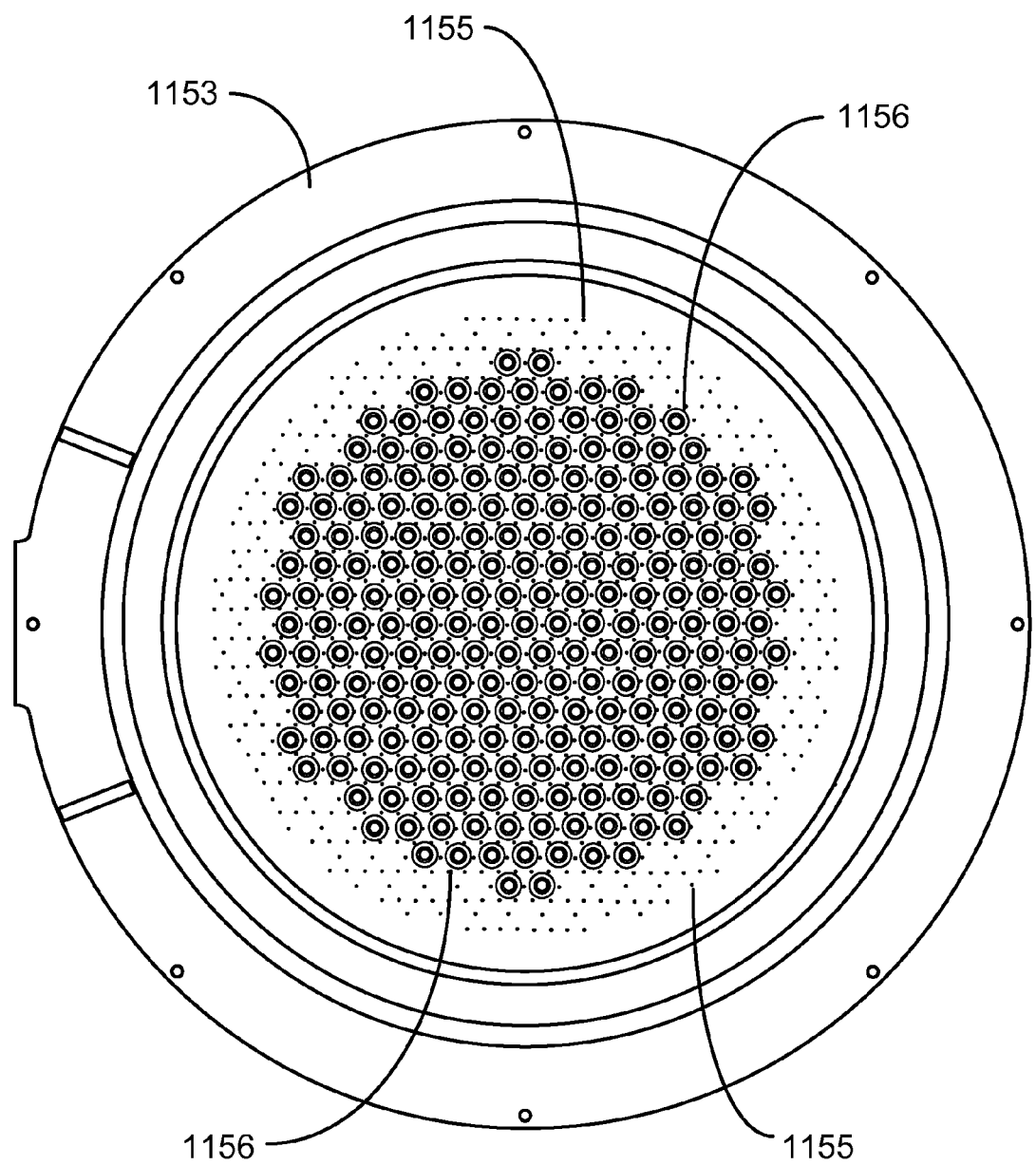
FIG. 3B shows a gas distribution showerhead according to embodiments of the invention.

FIG. 3B is a bottom view of a showerhead 1153 for use with a processing chamber according to disclosed embodiments. Showerhead 1153 corresponds with the showerhead shown in FIG. 3A. Through-holes 1156 are depicted with a larger inner-diameter (ID) on the bottom of showerhead 1153 and a smaller ID at the top. Small holes 1155 are distributed substantially evenly over the surface of the showerhead, even amongst the through-holes 1156 which helps to provide more even mixing than other embodiments described herein.

An exemplary film is created on a substrate supported by a pedestal (not shown) within substrate processing region 1170 when plasma effluents arriving through through-holes 1156 in showerhead 1153 combine with a silicon-free carbon-containing precursor arriving through the small holes 1155 originating from hollow volumes 1151. Substrate processing region 1170 may be equipped to support a plasma. A mild plasma is present in substrate processing region 1170 during deposition when forming some carbon films while no plasma is present during the growth of other exemplary films in disclosed embodiments.

A plasma may be ignited either in chamber plasma region 1120 above showerhead 1153 or substrate processing region 1170 below showerhead 1153. A plasma is present in chamber plasma region 1120 to produce the radical nitrogen precursor from an inflow of a nitrogen-and-hydrogen-containing gas. An AC voltage typically in the radio frequency (RF) range is applied between the conductive top portion 1121 of the processing chamber and showerhead 1153 to ignite a plasma in chamber plasma region 1120 during deposition. An RF power supply generates a high RF frequency of 13.56 MHz but may also generate other frequencies alone or in combination with the 13.56 MHz frequency. The top plasma power may be greater than or about 1000 Watts, greater than or about 2000 Watts, greater than or about 3000 Watts or greater than or about 4000 Watts in embodiments of the invention, during deposition of the flowable film.

The top plasma may be left at low or no power when the bottom plasma in the substrate processing region 1170 is turned on during a deposition or to clean the interior surfaces bordering substrate processing region 1170. A plasma in substrate processing region 1170 is ignited by applying an AC voltage between showerhead 1153 and the pedestal or bottom of the chamber. A cleaning gas may be introduced into substrate processing region 1170 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the deposition system. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack (e.g. sequential deposition of a silicon-nitrogen-and-hydrogen-containing layer and then a silicon-oxygen-and-carbon-containing layer) on a substrate, converting a film to silicon oxide or a process for cleaning a chamber can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A gas (or precursor) may be a combination of two or more gases (or precursors). A "radical precursor" is used to describe plasma effluents (a gas in an excited state which is exiting a plasma) which participate in a reaction to either remove material from or deposit material on a surface. A "radical-nitrogen precursor" is a radical precursor which contains nitrogen and a "radical-hydrogen precursor" is a radical precursor which contains hydrogen. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "gap" is used throughout with no implication that the etched geometry has a large horizontal aspect ratio. Viewed from above the surface, trenches may appear circular, oval, polygonal, rectangular, or a variety of other shapes. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon-free carbon-containing layer on a semiconductor substrate inside a substrate processing region within a chemical vapor deposition chamber, the method comprising:
   flowing a silicon-free carbon-containing precursor to the substrate processing region, wherein the silicon-free carbon-containing precursor comprises a hydrocarbon;
   reacting the silicon-free carbon-containing precursor in the substrate processing region to deposit a flowable silicon-free carbon-containing layer on the substrate, wherein the silicon-free carbon-containing layer is flowable as deposited on a surface of the semiconductor substrate and formed from the reacted silicon-free carbon-containing precursor, and wherein the silicon-free carbon-containing layer comprises C—H bonds.

2. The method of claim 1, wherein a temperature of the semiconductor substrate is below or about 400° C. during deposition of the flowable silicon-free carbon-containing layer on the substrate.

3. The method of claim 1, wherein a temperature of the semiconductor substrate is below or about 200° C. during deposition of the flowable silicon-free carbon-containing layer on the substrate.

4. The method of claim 1, wherein the silicon-free carbon-containing layer consists of carbon and hydrogen.

5. The method of claim 1, wherein the silicon-free carbon-containing layer consists of carbon, hydrogen and oxygen.

6. The method of claim 1, wherein the silicon-free carbon-containing layer consists of carbon, hydrogen and nitrogen.

7. The method of claim 1, wherein the silicon-free carbon-containing precursor consists of carbon and hydrogen.

8. The method of claim 1, wherein the silicon-free carbon-containing precursor consists of carbon, hydrogen and oxygen.

9. The method of claim 1, wherein the silicon-free carbon-containing precursor consists of carbon, hydrogen and nitrogen.

10. The method of claim 1, wherein the silicon-free carbon-containing precursor consists of carbon, hydrogen, nitrogen and oxygen.

11. The method of claim 1, wherein the silicon-free carbon-containing precursor contains no fluorine.

12. The method of claim 1, wherein the silicon-free carbon-containing precursor comprises an alkane, an alkene or an alkyne, methane, ethane, ethylene, acetylene, propane, propene, propyne, butane, butene, butyne, hexane, hexene, hexyne, heptane, heptene, heptyne, octane, octene, octyne, an aromatic hydrocarbon, benzene, toluene, xylene, mesitylene, phenol, anisole, cresol, furan, aniline, pyridine, pyrrole, a ketone, an imine or an ester.

13. The method of claim 1, wherein reacting the silicon-free carbon-containing precursor in the substrate processing region to deposit a flowable silicon-free carbon-containing layer on the substrate further comprises exciting the silicon-free carbon-containing precursor in a local plasma in the substrate processing region.

14. The method of claim 13, wherein the local plasma has a local plasma power of between 3 Watts and 100 Watts.

15. The method of claim 1, wherein the silicon-free carbon-containing precursor is flowed to the substrate processing region through a showerhead, and wherein a distance between the showerhead and the substrate is between 0.4" and 1.5".

16. The method of claim 1, wherein the silicon-free carbon-containing precursor is reacted with a hot wire or filament within the chemical vapor deposition chamber.

17. A method of forming a silicon-free carbon-containing layer on a semiconductor substrate, the method comprising:
flowing a silicon-free hydrocarbon precursor into a substrate processing region;
reacting the silicon-free carbon-containing precursor in the substrate processing region to deposit a silicon-free layer on a substrate, wherein the silicon-free carbon-containing layer produced by the reacted silicon-free carbon-containing precursor is flowable as deposited on a surface of the substrate, and wherein the reacting operation comprises a plasma-free reaction comprising a hot wire filament or UV treatment.

18. The method of claim 17, wherein the silicon-free layer comprises at least 85% carbon by atomic concentration.

19. The method of claim 17, wherein the silicon-free hydrocarbon precursor is selected from the group consisting of ethylene, acetylene, and toluene.

20. The method of claim 17, wherein the flowable characteristic of the as deposited film is caused by a removal of ionized species from an at least partial de-excitation of the silicon-free carbon-containing precursor subsequent the reacting operation.

* * * * *